(12) United States Patent
Oh

(10) Patent No.: US 7,998,814 B2
(45) Date of Patent: Aug. 16, 2011

(54) SEMICONDUCTOR MEMORY DEVICE AND METHOD OF FABRICATING THE SAME

(75) Inventor: Sang Hyun Oh, Kyeongki-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 375 days.

(21) Appl. No.: 12/133,775

(22) Filed: Jun. 5, 2008

(65) Prior Publication Data

US 2009/0140319 A1 Jun. 4, 2009

(30) Foreign Application Priority Data

Nov. 29, 2007 (KR) .................. 10-2007-0122617

(51) Int. Cl.
 *H01L 29/788* (2006.01)
 *H01L 21/336* (2006.01)
(52) U.S. Cl. ........ 438/260; 257/315; 257/316; 257/317; 438/264
(58) Field of Classification Search .................. 257/317, 257/315; 438/260
 See application file for complete search history.

(56) References Cited

U.S. PATENT DOCUMENTS

| | | | | |
|---|---|---|---|---|
| 5,714,766 | A * | 2/1998 | Chen et al. ........... | 257/17 |
| 6,936,884 | B2 * | 8/2005 | Chae et al. ........... | 257/315 |
| 7,045,854 | B2 * | 5/2006 | Osabe et al. ........... | 257/317 |
| 7,119,394 | B2 * | 10/2006 | Hsieh et al. ........... | 257/316 |
| 7,732,853 | B2 * | 6/2010 | Kim ........... | 257/315 |
| 2004/0232477 | A1 * | 11/2004 | Iwata et al. ........... | 257/315 |
| 2006/0033146 | A1 * | 2/2006 | Wang ........... | 257/315 |
| 2006/0033152 | A1 * | 2/2006 | Kim et al. ........... | 257/321 |
| 2006/0124991 | A1 * | 6/2006 | Ohba ........... | 257/324 |
| 2006/0186462 | A1 * | 8/2006 | Han et al. ........... | 257/315 |
| 2006/0192243 | A1 * | 8/2006 | Bhattacharyya ........... | 257/315 |
| 2007/0052004 | A1 * | 3/2007 | Chao et al. ........... | 257/315 |
| 2008/0135914 | A1 * | 6/2008 | Krishna et al. ........... | 257/316 |
| 2008/0246101 | A1 * | 10/2008 | Li et al. ........... | 257/412 |
| 2009/0212344 | A1 * | 8/2009 | Lee ........... | 257/317 |

FOREIGN PATENT DOCUMENTS

| | | |
|---|---|---|
| JP | 11-150195 | 6/1999 |
| KR | 1020060076039 | 7/2006 |
| KR | 1020060111218 | 10/2006 |

(Continued)

OTHER PUBLICATIONS

Yoo, Seong-Jong et al. "A new quantum dot formation process using wet etching of poly-Si along grain boundaries" Int. Microprocesses and Nanotechnology Conference, 2000 Jun. 13, 2000 pp. 248-249.*

(Continued)

*Primary Examiner* — N Drew Richards
*Assistant Examiner* — Grant S Withers
(74) *Attorney, Agent, or Firm* — Lowe Hauptman Ham & Berner LLP

(57) ABSTRACT

A semiconductor memory devices and a method of fabricating the same includes sequentially stacking a tunnel insulating layer, a first nano-grain film, a conductive layer for a floating gate, and a second nano-grain film over a semiconductor substrate, forming a trench by etching the second nano-grain film, the conductive layer for the floating gate, the first nano-grain film, the tunnel insulating layer, and the semiconductor substrate, gap-filling the trench with an insulating layer, thus forming an isolation layer, and forming a third nano-grain film on sidewalls of the conductive layer for the floating gate.

9 Claims, 3 Drawing Sheets

FOREIGN PATENT DOCUMENTS

KR            100741272         7/2007
WO     WO 2006112683      * 10/2006

OTHER PUBLICATIONS

Ecoffey, Serge et al. "Low-pressure chemical vapour deposition of nanograin polysilicon ultra-thin ifilms" Nanotechnology 13 290 Issue 3 Jun. 2002 pp. 290-293.*

Ecoffey, Serge et al. "LPCVD deposition techniques for nanograin sub-10nm polysilicon ultra-thin films" Mat. Res. Soc. Symp. A Proc. vol. 686 Fall 2001 pp. A6.4.1-A6.4.6.*

Korean Notice of Allowance dated Feb. 18, 2010 for Korean patent application No. 10-2007-0122617, where the attached references were cited.

Office Action dated Jun. 26, 2009, for Korean application No. 10-2007-0122617.

* cited by examiner

SEMICONDUCTOR MEMORY DEVICE AND METHOD OF FABRICATING THE SAME

CROSS-REFERENCES TO RELATED APPLICATIONS

The present application claims priority to Korean patent application number 10-2007-0122617, filed on Nov. 29, 2007, which is incorporated by reference in its entirety.

BACKGROUND OF THE INVENTION

The present invention relates to semiconductor memory devices and a method of fabricating the same and, more particularly, to semiconductor memory devices and a method of fabricating the same, in which threshold voltage distributions of semiconductor memory cells can be improved.

A flash memory cell of semiconductor memory devices has a structure in which a tunnel oxide layer, a conductive layer for a floating gate, a dielectric layer, and a conductive layer for a control gate are sequentially stacked over a semiconductor substrate. Program and erase operations of the flash memory cell are performed by injecting or draining electrons into or from the conductive layer for the floating gate.

FIG. 1 is a sectional view illustrating a conventional method of fabricating a semiconductor memory device.

Referring to FIG. 1, a tunnel oxide layer 11 and a polysiliocn layer 12 for a floating gate are formed over a semiconductor substrate 10. The polysiliocn layer 12 and the tunnel oxide layer 11 are selectively etched to thereby expose an isolation region of the semiconductor substrate 10. Then, a trench 13 is formed by etching the exposed semiconductor substrate 10. The trench 13 is gap-filled with an insulating layer, thus forming an isolation layer 14.

Although not shown in the drawing, a dielectric layer and a conductive layer for a control gate are sequentially stacked on the entire surface including the isolation layer 14, thus forming a semiconductor memory device.

When a program operation is performed on the conventional semiconductor memory device, program threshold voltages of respective memory cells differ, thereby forming a distribution in program threshold voltages. This is caused by traps included in the insulating layer near the floating gate. The traps are irregular due to the grains of polycrystalline silicon at the boundary of the conductive layer for the floating gate and the insulating layer. Phosphorous (P) ions, injected into the conductive layer for the floating gate, are distributed in large quantities at the boundary region of the insulating layer and the conductive layer for the floating gate which has large grains. It has an influence on the characteristics of the insulating layer such as a tunnel oxide layer, which comes in contact with the conductive layer for the floating gate.

If a program threshold voltage distribution of a memory cell is widened, device characteristics and uniformity are degraded. It results in significant low margin and decreased reliability of devices, particularly in a device having a narrow cell distribution margin such as a multi-level cell (MLC).

BRIEF SUMMARY OF THE INVENTION

The present invention is directed towards semiconductor memory devices and a method of fabricating the same, in which the surface of a floating gate of the semiconductor memory device is surrounded by nano-grain films, thus improving the threshold voltage distribution of the semiconductor memory device and hence enhancing the yield and reliability of the device.

A semiconductor memory device in accordance with an aspect of the present invention includes a tunnel insulating layer, a floating gate, a dielectric layer, and a control gate sequentially formed over a semiconductor substrate, and a nano-grain film surrounding the floating gate.

The nano-grain film is 10 to 100 angstrom in thickness.

A method of fabricating a semiconductor memory device in accordance with another aspect of the present invention includes sequentially stacking a tunnel insulating layer, a first nano-grain film, a conductive layer for a floating gate, and a second nano-grain film over a semiconductor substrate, forming a trench by etching the second nano-grain film, the conductive layer for the floating gate, the first nano-grain film, the tunnel insulating layer, and the semiconductor substrate, gap-filling the trench with an insulating layer, thus forming an isolation layer, and forming a third nano-grain film on sidewalls of the conductive layer for the floating gate.

The first to third nano-grain films are formed by depositing an amorphous silicon layer and crystallizing the deposited amorphous silicon layer through annealing. The annealing is performed using a rapid thermal processing (RTP) or a laser annealing method. The first to third nano-grain films are 10 to 100 angstrom in thickness.

DESCRIPTION OF THE PREFERRED EMBODIMENTS

Now, a specific embodiment according to the present invention will be described with reference to the accompanying drawings. It should be noted that the present invention is not limited to the disclosed embodiment, and may be implemented in various manners. The embodiment described herein is provided to allow a person having ordinary skill in the art to understand the present invention.

FIGS. 2 to 7 are sectional views illustrating a method of fabricating a semiconductor memory device in accordance with an embodiment of the present invention.

Figure 1:
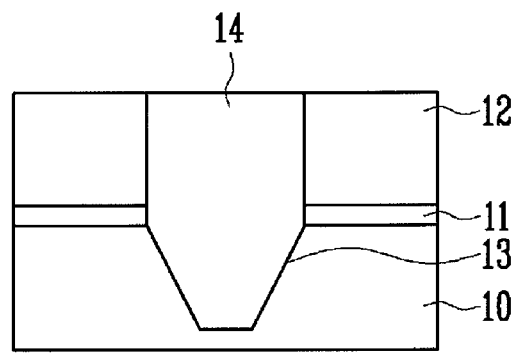
FIG. 1 is a sectional view illustrating a conventional method of fabricating a semiconductor memory device.
Figure 2:
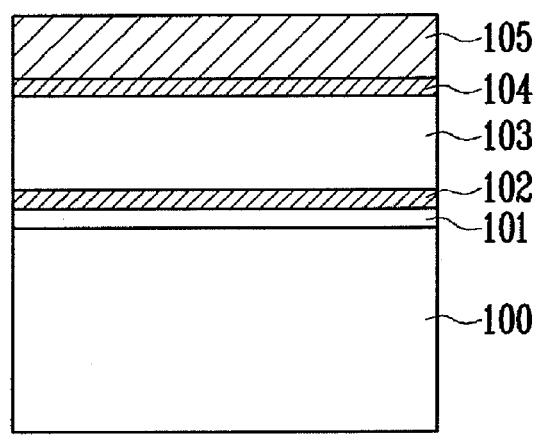
FIGS. 2 to 7 are sectional views illustrating a method of fabricating a semiconductor memory device in accordance with an embodiment of the present invention.

Referring to FIG. 2, a tunnel insulating layer 101, a first nano-grain film 102, a conductive layer 103 for a floating gate, a second nano-grain film 104, and a hard mask layer 105 are sequentially formed over a semiconductor substrate 100. The tunnel insulating layer 101 can be formed of an oxide layer. The first and second nano-grain films 102, 104 can be formed by depositing a thin amorphous silicon layer and crystallizing the deposited amorphous silicon layer using rapid thermal processing (RTP) or a laser annealing process. The first and second nano-grain film 102, 104 can be formed by depositing a polysiliocn layer at a high temperature of 600 to 900 degrees Celsius. If the polysiliocn layer is deposited at high temperature, a nano-grain film of a uniform size can be formed since grains are thermally grown simultaneously with the deposition. The first and second nano-grain films 102, 104 are deposited using the polysiliocn layer, wherein at the time of the deposition process, a boundary surface is formed between films, which are deposited by injecting a nitrogen gas periodically, so that uniform nano-grain films can be formed. The first and second nano-grain films 102, 104 can be formed to a thickness of 10 to 100 angstrom.

The conductive layer for the floating gate can be formed of a polysilicon layer.

Figure 3:
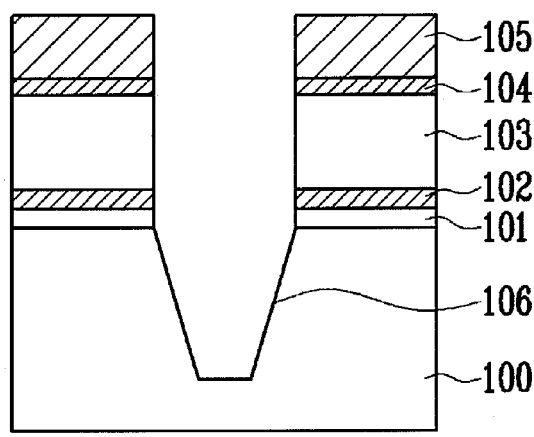

Referring to FIG. 3, the hard mask layer 105 is selectively etched and patterned. Thereafter, the second nano-grain film 104, the conductive layer 103 for the floating gate, the first nano-grain film 102, the tunnel insulating layer 101, and the semiconductor substrate 100 are sequentially etched using an etch process employing the hard mask layer 105, thereby forming a trench 106 for isolation.

Figure 4:
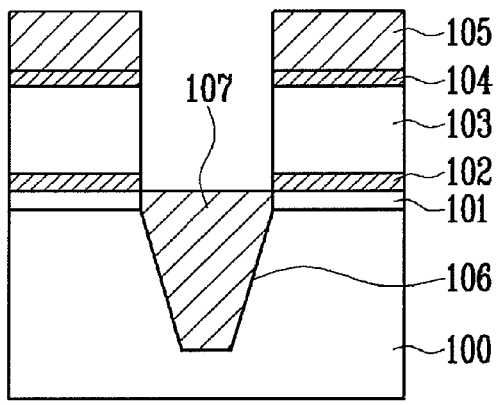

Referring to FIG. 4, an insulating layer is formed on the entire surface, including the trench 106, in order to gap-fill the trench 106. An isolation layer 107 is then formed by performing a polishing process until the hard mask layer 105 is exposed.

Thereafter, a top surface of the isolation layer 107 is etched using an etch-back process, thus exposing the sidewalls of the conductive layer 103 for the floating gate. Here, the depth of the etched top surface of the isolation layer 107 is sufficiently great enough to lower the effective field height (EFH) oxide layer.

Figure 5:
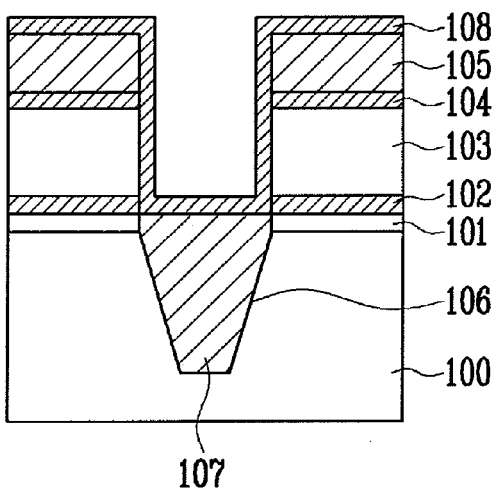

Referring to FIG. 5, a third nano-grain film 108 is formed on the entire surface including the isolation layer 107.

The third nano-grain film 108 can be formed by depositing a thin amorphous silicon layer and crystallizing the deposited amorphous silicon layer using RTP or a laser annealing process. The third nano-grain film 108 can be formed by depositing a polysiliocn layer at a high temperature of 600 to 900 degrees Celsius. If the polysiliocn layer is deposited at high temperature as described above, a nano-grain film of a uniform size can be formed since grains are thermally grown simultaneously with the deposition. The third nano-grain film 108 is deposited using the polysiliocn layer, wherein at the time of the deposition process, a boundary surface is formed between films, which are deposited by periodically injecting a nitrogen gas, so that uniform nano-grain films can be formed. The third nano-grain film 108 can be formed to a thickness of 10 to 100 angstrom.

Figure 6:
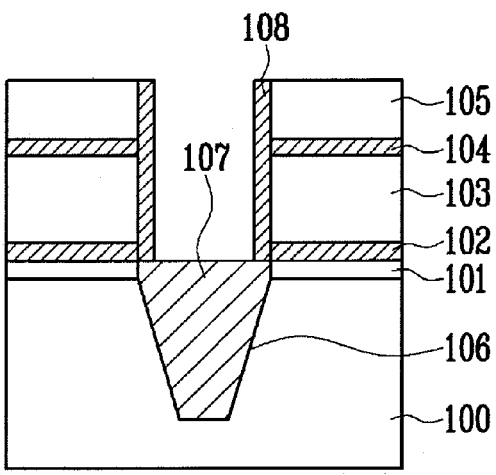

Referring to FIG. 6, an etch process is performed in order to remove the nano-grain film 108 formed at the top surfaces of the hard mask layer 105 and the isolation layer 107. After the etch process, the third nano-grain film 108 remains on the sidewalls of the conductive layer 103 for the floating gate 103.

Figure 7:
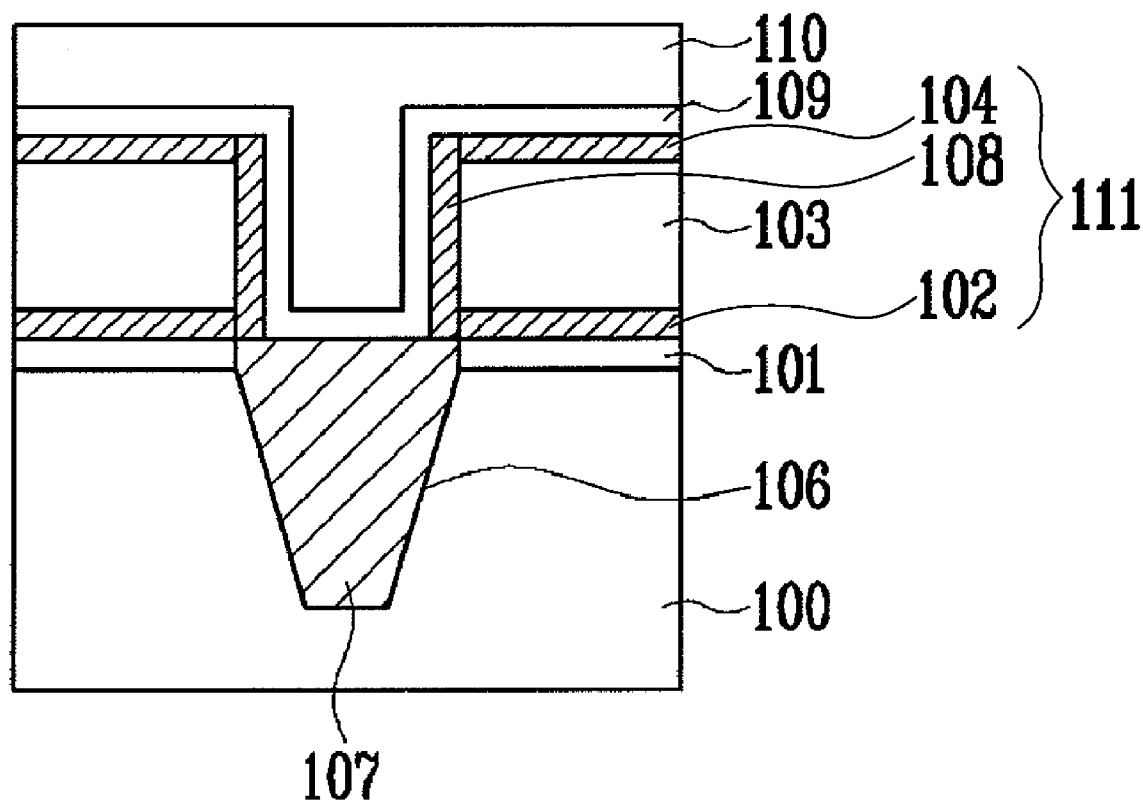

Referring to FIG. 7, the exposed hard mask layer 105, and the third nano-grain film 108 on the sidewalls of the hard mask layer 105 are removed.

Thereafter, a dielectric layer 109 and a conductive layer 110 for a control gate are sequentially formed on the entire surface, including the second nano-grain film 104 and the isolation layer 107. The dielectric layer can have an ONO structure in which oxide/nitride/oxide layers are sequentially stacked. The dielectric layer can be formed using an oxide layer with a high dielectric constant, for example, $Al_2O_3$, $HfO_2$ or $ZrO_2$. The conductive layer 110 for the control gate can be formed of a polysiliocn layer. A low-resistance layer (a metal gate layer) may be further formed on the conductive layer 110 for the control gate.

As described above, according to the present invention, the surface of the floating gate of the semiconductor memory device is surrounded by the nano-grain films. Accordingly, threshold voltage distributions of the semiconductor memory device can be improved and, therefore, the yield and reliability of the device can be enhanced.

The embodiment disclosed herein allows a person skilled in the art to easily implement the present invention, and the person skilled in the art may implement the embodiment of the present invention in various ways. Therefore, the scope of the present invention is not limited by or to the embodiment as described above, and should be construed, to be defined only by the appended claims and their equivalents.

What is claimed is:

1. A semiconductor memory device, comprising:
    a tunnel insulating layer, a first nano-grain film, a floating gate, and a second nano-grain film sequentially formed over a semiconductor substrate; and
    a third nano-grain film formed on sidewalls of the floating gate.

2. The semiconductor memory device of claim 1, wherein the first to third nano-grain films are 10 to 100 angstrom in thickness.

3. The semiconductor memory device of claim 1, wherein the first to third nano-grain films are formed of amorphous silicon.

4. A method of fabricating a semiconductor memory device, comprising:
    sequentially stacking a tunnel insulating layer, a first nano-grain film, a conductive layer for a floating gate, and a second nano-grain film over a semiconductor substrate;
    forming a trench by etching the second nano-grain film, the conductive layer for the floating gate, the first nano-grain film, the tunnel insulating layer, and the semiconductor substrate;
    forming an isolation layer to fill the trench; and
    forming a third nano-grain film on sidewalls of the conductive layer for the floating gate.

5. The method of claim 4, wherein the first to third nano-grain films are formed by depositing an amorphous silicon layer and crystallizing the deposited amorphous silicon layer through annealing.

6. The method of claim 5, wherein the annealing is a rapid thermal processing (RTP) or a laser annealing method.

7. The method of claim 4, wherein the first to third nano-grain films are 10 to 100 angstrom in thickness.

8. The method of claim 4, wherein the first to third nano-grain films are formed by depositing a polysiliocn layer at a high temperature of 600 to 900 degrees Celsius.

9. The method of claim 4, wherein the first to third nano-grain films are formed by depositing a polysiliocn layer, wherein at the time of a deposition process, a boundary surface is formed between the films deposited by injecting a nitrogren gas periodically.

* * * * *